United States Patent [19]

Chhabra et al.

[11] Patent Number: 5,089,084
[45] Date of Patent: Feb. 18, 1992

[54] HYDROFLUORIC ACID ETCHER AND CASCADE RINSER

[75] Inventors: Navjot Chhabra; Loyal Gibbons, both of Boise, Id.

[73] Assignee: Micron Technology, Inc., Boise, Id.

[21] Appl. No.: 620,744

[22] Filed: Dec. 3, 1990

[51] Int. Cl.⁵ .......... B44C 1/22; C03C 15/00; C03C 25/06
[52] U.S. Cl. .................. 156/646; 134/31; 134/102; 156/657; 156/345
[58] Field of Search ........... 156/345, 646, 657, 662; 252/79.3; 134/25.1, 31, 102

[56] References Cited

U.S. PATENT DOCUMENTS

| | | | |
|---|---|---|---|
| 3,879,597 | 4/9175 | Bersin et al. | 219/121 P |
| 3,990,462 | 11/1976 | Elftmann et al. | 134/102 |
| 4,609,573 | 2/1986 | Omata et al. | 427/403 |
| 4,682,614 | 7/1987 | Silvernail et al. | 134/99 |
| 4,682,615 | 7/1987 | Burkman et al. | 134/102 |
| 4,691,722 | 8/1987 | Silvernail et al. | 134/155 |
| 4,749,440 | 6/1988 | Blackwood et al. | 156/646 |
| 4,900,395 | 2/1990 | Syverson et al. | 156/639 |

Primary Examiner—William A. Powell
Attorney, Agent, or Firm—Albert M. Crowder, Jr.

[57] ABSTRACT

An apparatus used to HF gas etch a plurality of integrated circuit wafers within an etch chamber, followed by a de-ionized water cascade rinse in the chamber. On completion of the rinse and removal of the wafer carriers, the apparatus, housing, and supply conduits are purged with an inert gas to prepare the apparatus for a next batch of wafer carriers. The apparatus includes process-control means for automatically controlling each step of the process.

13 Claims, 7 Drawing Sheets

FIGURE 11

HYDROFLUORIC ACID ETCHER AND CASCADE RINSER

FIELD OF THE INVENTION

This invention relates to semiconductor manufacture and, more particularly, to an apparatus for performing gaseous etching and cascade rinsing of a batch of silicon wafers.

BACKGROUND OF THE INVENTION

In the processing of semiconductor wafers of silicon and the like in the manufacture of integrated circuit (IC) chips, etching of oxide layers or films on the surface of the wafer is an important aspect of the processing.

Much of the wafer processing in the past has utilized a wet etching process. This involves spraying a liquid acid and other liquid chemicals onto silicon wafers followed by rinsing with de-ionized water. The wafers are typically confined in wafer carriers, formed of a material capable of withstanding the deteriorating effects of strong chemicals such as acids.

One such etching apparatus includes wafer carriers carried on a variable speed turntable or rotor in a closed bowl. Such a machine has many variable phases in its operation including varying the speed of the rotor, sequentially spraying various liquid processing chemicals, and introducing nitrogen gas for drying the wafers between various wet processing phases. One such acid processor is illustrated and described in U.S. Pat. No. 3,990,462. U.S. Pat. Nos. 4,609,573; 4,682,615; and 4,691,722 also disclose variations in spray nozzle arrangements and other facilities for wet etch processing. Additionally, U.S. Pat. No. 4,682,614 discloses a nearly horizontal, wet-etching machine.

Etching of silicon wafers has also been carried out with plasma of certain gases. U.S. Pat. No. 3,879,597 discloses apparatus for simultaneously etching a number of wafers using plasma techniques.

Etching of oxide films on silicon wafers has been accomplished, in more recent years, with the use of anhydrous hydrogen fluoride gas. See, for instance, U.S. Pat. No. 4,749,440. The etchant hydrogen fluoride gas is usually diluted with dry nitrogen gas. A small amount of moisture, either as a vapor mixed with the hydrogen fluoride gas or contained in the oxide film being etched, is necessarily present to react with the oxide in the film to initiate the etching process.

U.S. Pat. No. 4,900,395 discloses a method and apparatus for etching a batch of wafers in a rotating bowl and processing chamber with the wafers being stacked horizontally around a central spray tube. In a second embodiment, the wafer carrier is rotated within a drum having multiple nozzles. A third embodiment has a processing chamber at an almost horizontal position, again rotating a drum containing a wafer carrier holding wafers stacked almost vertically on edge.

In most of these processes, for both wet etching and gaseous etching, there is a rotating inner chamber that holds the wafers or wafer carriers so as to evenly diffuse the gas or liquids over the wafer surfaces. The use of a rotating inner chamber necessitates the use of bearings and other moving parts which are degraded by the extremely corrosive nature of the etchants. Moreover, the wafers must be rinsed after etching by a separate apparatus. This necessitates exposure of the etched wafer to atmosphere during movement of the wafers to the rinsing apparatus and introduces another variable which adversely affects the processed wafer.

It is thus a object of this invention to provide a simpler, no-moving-parts wafer etch chamber that is not affected by corrosive etchants. It is a further object of the invention to provide an apparatus that automatically sequentially processes a batch of wafers by a process which washing the wafers with a cascade water flow of deionized (DI) water, cleaning the chamber by a spray rinse, and, finally, drying the chamber in preparation for the next batch of wafers. This process is performed with no exposure of the wafers to the atmosphere.

It is another object of this invention to provide an automated control means that follows a programmed sequence to control the etching process including directing of HF gas, $N_2$, and DI water onto the wafers and the discharge of these gases and liquids.

Since rotation involves mechanical friction and wear of parts creating undesirable particulate and additional maintenance, it is another object of this invention to eliminate the need to rotate the wafer carrier or the spray or gas nozzles. Additionally, the acid etcher is adapted for use with commercially available 150 mm wafer carriers, i.e., a wafer carrier formed in a box-shape, approximately 150 mm on a side, capable of carrying 25 wafers each.

It is another object of this invention to provide a self-contained apparatus that houses an etch chamber, valves, controls, piping, tanks, meters, and gas storage.

SUMMARY OF THE INVENTION

In accordance with the present invention, a hydrofluoric acid etcher and cascade rinser for automatically processing a batch of semiconductor wafers is provided. The apparatus of the invention generally stated comprises a housing and a etch chamber contained within the housing in which hydrogen fluoride, humidified nitrogen, and a cascade or bath of deionized water are directed in a controlled sequence over both sides of a plurality of silicon wafers contained in a plurality of wafer carriers. Hydrogen fluoride storage tanks an process control means are also contained within the housing. Additionally, the etch chamber includes a central divider for separately containing each of four wafer carriers. A plurality of conduits mounted within the central divider and etch chamber walls are coupled to the HF tanks, and to sources of DI water and nitrogen. These fluids are directed through various discharge openings in the divider and etch chamber walls in a controlled sequence and over the wafers contained within the carriers to provide controlled etching and rinsing of the wafers.

A batch of wafers can be processed by a method including the steps of:

1. loading a plurality of wafers in wafer carriers and into an etch chamber;
2. sealing the etch chamber;
3. gas etching the wafers (i.e., less than a minute to remove 8000Å of thermal silicon dioxide);
4. rinsing the wafers in a cascade and bath of DI water;
5. washing the etch chamber;
6. unloading the wafers from the etch chamber for transfer to a separate drier apparatus; and
7. purging and drying the etch chamber in preparation for processing a next batch of wafers.

The apparatus of the invention allows wafers to be processed automatically in the above sequence. Additionally, the apparatus of the invention provides improved etching and rinsing of the wafers over prior art apparatus without the use of complicated moving components. Moreover, the apparatus of the invention accomplishes etching and rinsing in a continuous sequence so the wafers are not exposed to atmosphere until after rinsing.

Other objects, advantages, and capabilities of the present invention will become more apparent as the description proceeds.

DETAILED DESCRIPTION OF THE PREFERRED EMBODIMENT

A hydrofluoric acid etcher and cascade rinser constructed in accordance with the invention is shown in FIGS. 1-9. The apparatus generally stated includes a sealable housing 8 (FIG. 8), an etch chamber 10 (FIG. 1) contained within the housing, and control means contained within the housing in the form of an automatic controller 9 for controlling etch, rinse, clean, and purge cycles of the apparatus.

Figure 1:
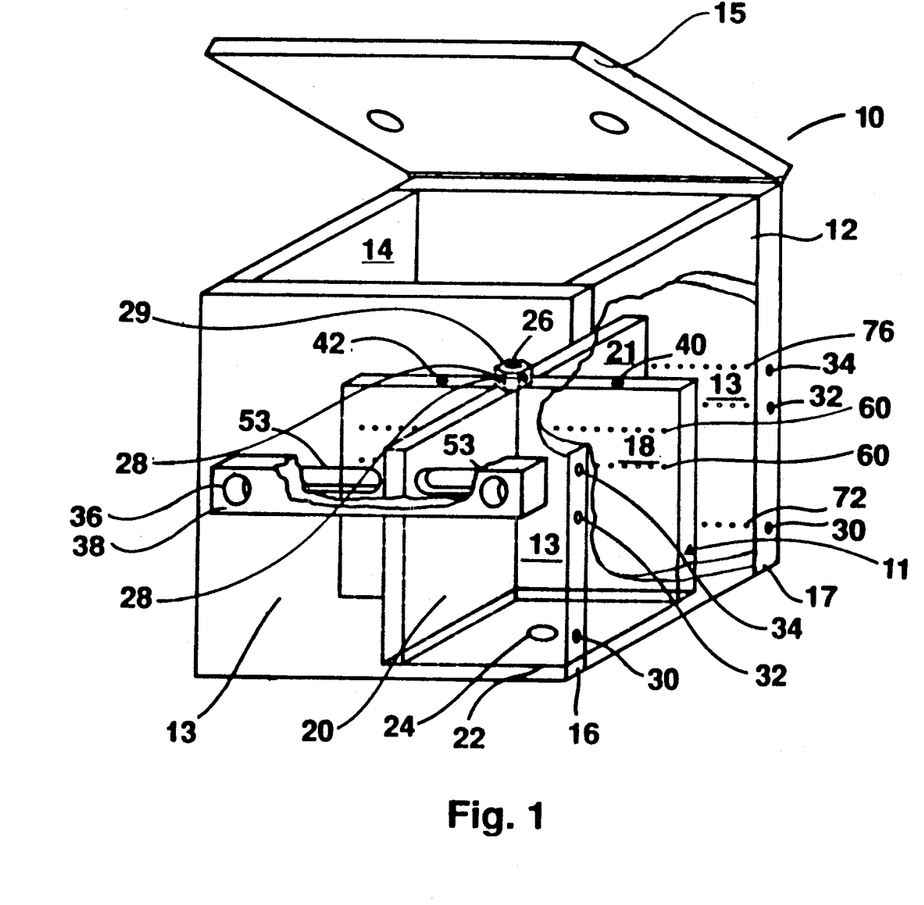
FIG. 1 is a cutaway perspective view of an etch chamber portion of an acid etcher and cascade rinser constructed in accordance with the present invention.
Figure 10:
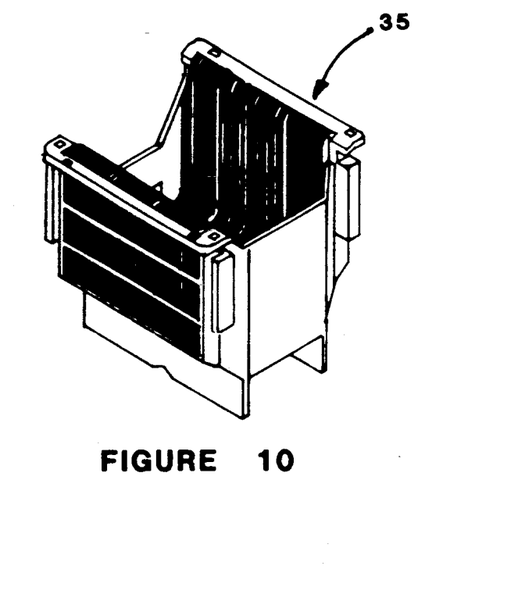
FIG. 10 is a perspective view of a commercially available wafer carrier for use with the apparatus of the invention.
Figure 11:
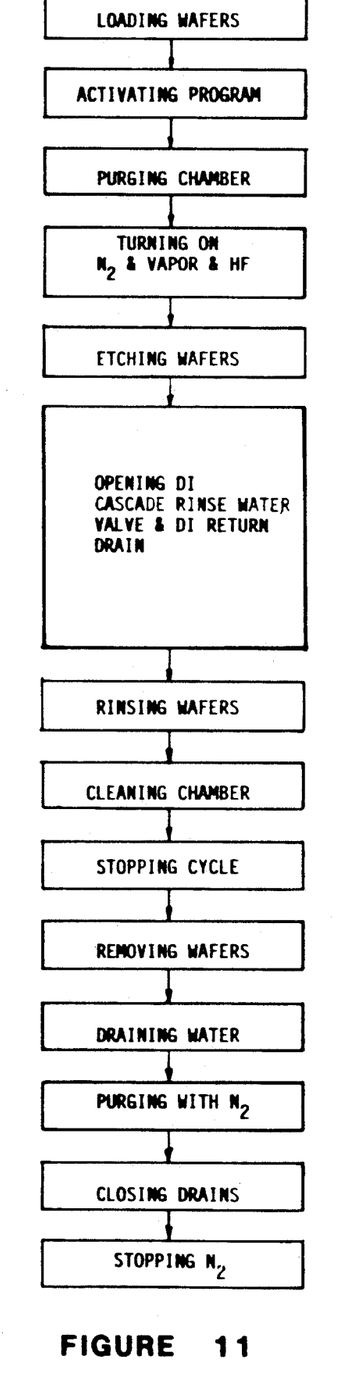
FIG. 11 is a flow diagram of the invention.

Referring now to FIG. 1, the etch chamber 10 is shown with a front section 12 partially cut away. In general, the etch chamber 10 is a four-sided, generally rectangular-shaped structure contained within the housing 8 of the apparatus. The etch chamber 10 includes a four-sided interior generally X-shaped center divider 11 which forms four separate interior chambers 13 for retaining four separate wafer carriers 35 (FIG. 10). Each wafer carrier 35 as shown in FIG. 10 is configured to retain a plurality of vertically oriented spaced wafers. One such suitable wafer carrier is manufactured by Flourware and designated as part number A194-60MB. The wafer carrier 35 has an overall size of 5.65"×7.00"×6.75" and is configured to retain 25 semiconductor wafers.

In general, the etch chamber 10 is opened at the hinged lid 15 and four wafer carriers 35 can be set into the four separate interior chambers 13 (FIG. 2A) within the etch chamber 10 formed by the four-sided center divider 11 and the sidewalls of the etch chamber.

The front section 12 and back section 14 of the etch chamber 10 are solid plates of identical construction. Two end sections 16 and 17 attach to the front 12 and back sections 14, respectively, to form a generally box-like structure. The center divider 11 is mounted within the etch chamber and includes a center divider portion 18 and side divider portions 20 and 21. Each of the four interior sections 13 has a bottom portion 22, having a bottom drain 24 therein.

Figure 3A:
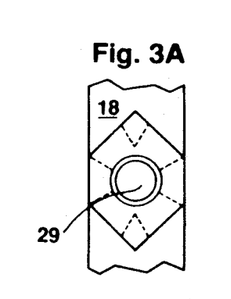
FIG. 3A is a top view of a spray post of the invention.
Figure 3B:
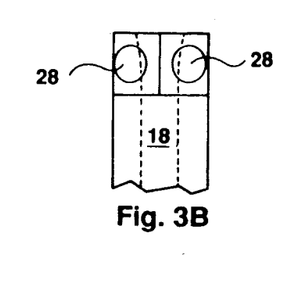
FIG. 3B is a side view of the spray post of the invention.
Figure 3C:
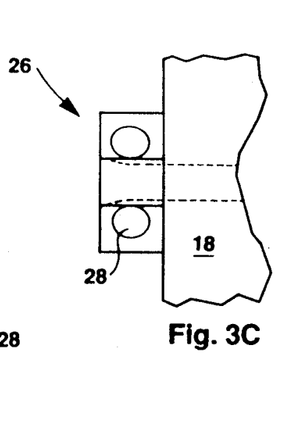
FIG. 3C is a front view of the spray post of the invention.

A spray post 26 is located at the top center of center divider 13. The spray post 26 has four apertures 28 on the sides and a fifth aperture 29 on the top (FIGS. 3A-3C). The four threaded apertures 28 are for spray nozzles to direct de-ionized (DI) water up towards the lid 15 following cascade rinse overflow period. The solid walls of the center divider are formed with passageways or bores that provide conduits for the DI water to the spray post 26, and for HF and humidified nitrogen gases to various discharge openings utilized in the etching process. Likewise, the end sections 16,17 of the etch chamber 10 are formed with passageways, conduits, and various discharge openings as will hereinafter be explained.

Each of the end sections 16,17 of the etch chamber 10 has a ¼" NPT (National Pipe Thread) threaded aperture 30 for a DI water supply connection to provide DI water through internal passageways within the end sections 16,17. Water can thus be directed into the lower portion of the chamber sections until it overflows or cascades through slots 53 and out through apertures 36 in slot cover 38 (shown partially cut away). Piping connections (not shown) discharge the water to a DI water return drain. A lower and an upper ¼" NPT threaded aperture 32,34 for HF gas supply are provided above the ¼" DI water aperture 30.

With reference to FIGS. 2A through 2D, the central divider 18 also includes apertures 40 and 42 which have ¼" NPT thread connections for additional spray nozzles. These apertures 40,42 are coupled to internal passageways within the central divider 18 to provide conduits for directing DI water to lid area over the wafer carrier 35. This provides a spray of DI water for thoroughly rinsing and cleaning the chamber lid 15 and section 13 upper walls. The apertures 40,42 are connected by horizontal passageways to each other and to a vertical passageway through the central divider. The vertical passageway also connects to the spray post apertures 28,29. The vertical passageway terminates at a ¼" NPT thread connection 48 which is the DI water supply connection.

Figures 2A, 2B, 2C, 2D:
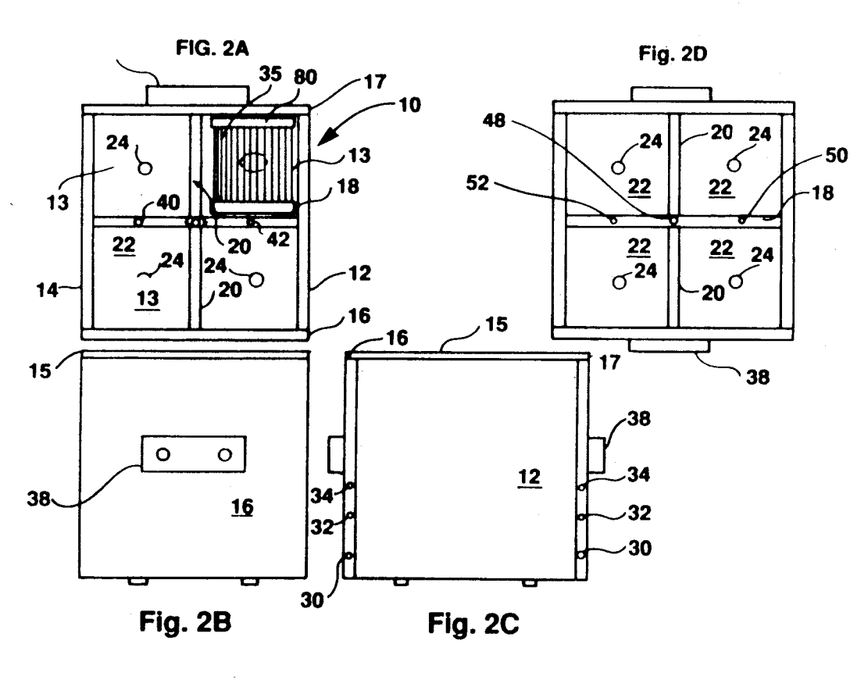
FIG. 2A is a top view of the etch chamber of the invention.
FIG. 2B is a side elevation view of the etch chamber of the invention.
FIG. 2C is a front elevation view of the etch chamber of the invention.
FIG. 2D is a bottom view of the etch chamber of the invention.

Additionally, as shown in FIG. 2D, ¼" NPT threaded apertures 50 and 52 are formed in the central divider 18 as supply conduits for HF gas. Moreover, as shown in FIG. 2B, slot covers 38 are provided in the end sections 16,17 of the etching chamber 10 to provide for a DI water bath rinse and cascading overflow during the wafer rinse period.

Figure 4A:
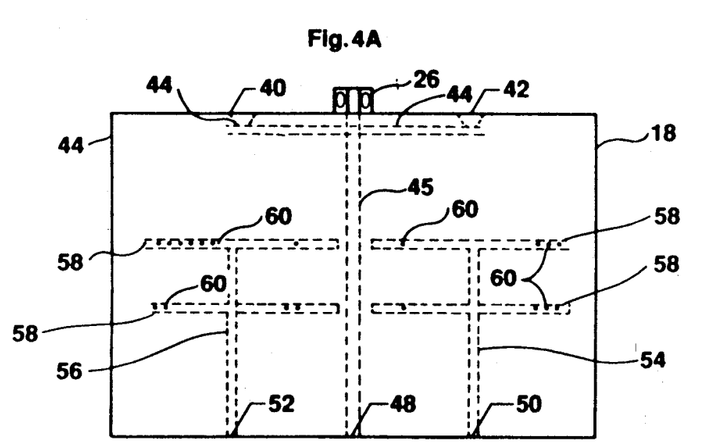
FIG. 4A is a front view of an etch chamber divider of the invention.
Figure 4B:
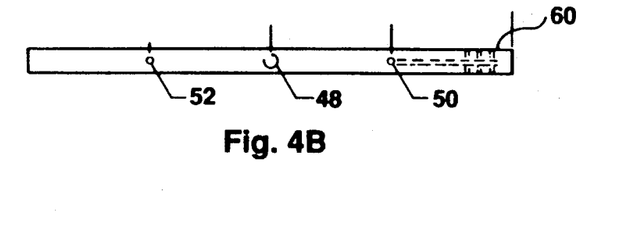
FIG. 4B is a bottom view of the etch chamber divider of the invention.

Referring now to FIG. 4, these ⅛" NPT threaded HF apertures 50,52 are each connected by ¼" vertical bores or passageways 54,56 to two pairs of horizontal ¼" bores 58 that have thirteen connecting discharge orifices 60 drilled through the face of the central divider 18. These discharge orifices 60 are formed with an outside diameter of about 3/64".

Figure 5A:
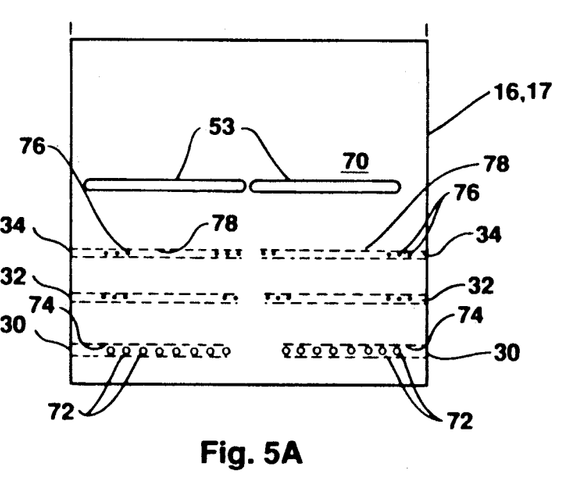
FIG. 5A is a front view of the etch chamber end of the invention.
Figure 5B:
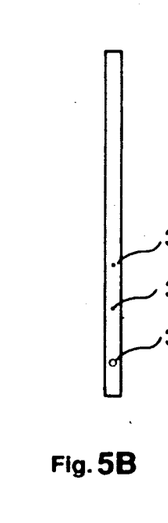
FIG. 5B is a side view of the etch chamber end of the invention.

The etch chamber end sections 16 and 17 are shown in more detail in FIGS. 5A and 5B without the slot covers 38. On each end section 16 and 17 is a DI water aperture 30 for the DI water supply conduit. These supply apertures 30 communicate through suitable passageways 74 in the central divider 18 with eight orifices 72 on the DI discharge inner face 70.

Above the sixteen DI discharge orifices are a total of forty-eight smaller 3/64" HF discharge orifices 76 that communicate with ¼" passageways 78 to provide HF gas to an outer side 80 of wafer carrier 35 (FIG. 1). These HF discharge orifices 76 are located at an elevation similar to the four rows of HF gas discharge orifices 60 on each side of central divider 18 (FIG. 4). A plurality of separated wafers contained within the wafer carrier 35 can thus be surrounded with HF gas for etching and thoroughly rinsed with DI water.

Figure 6:
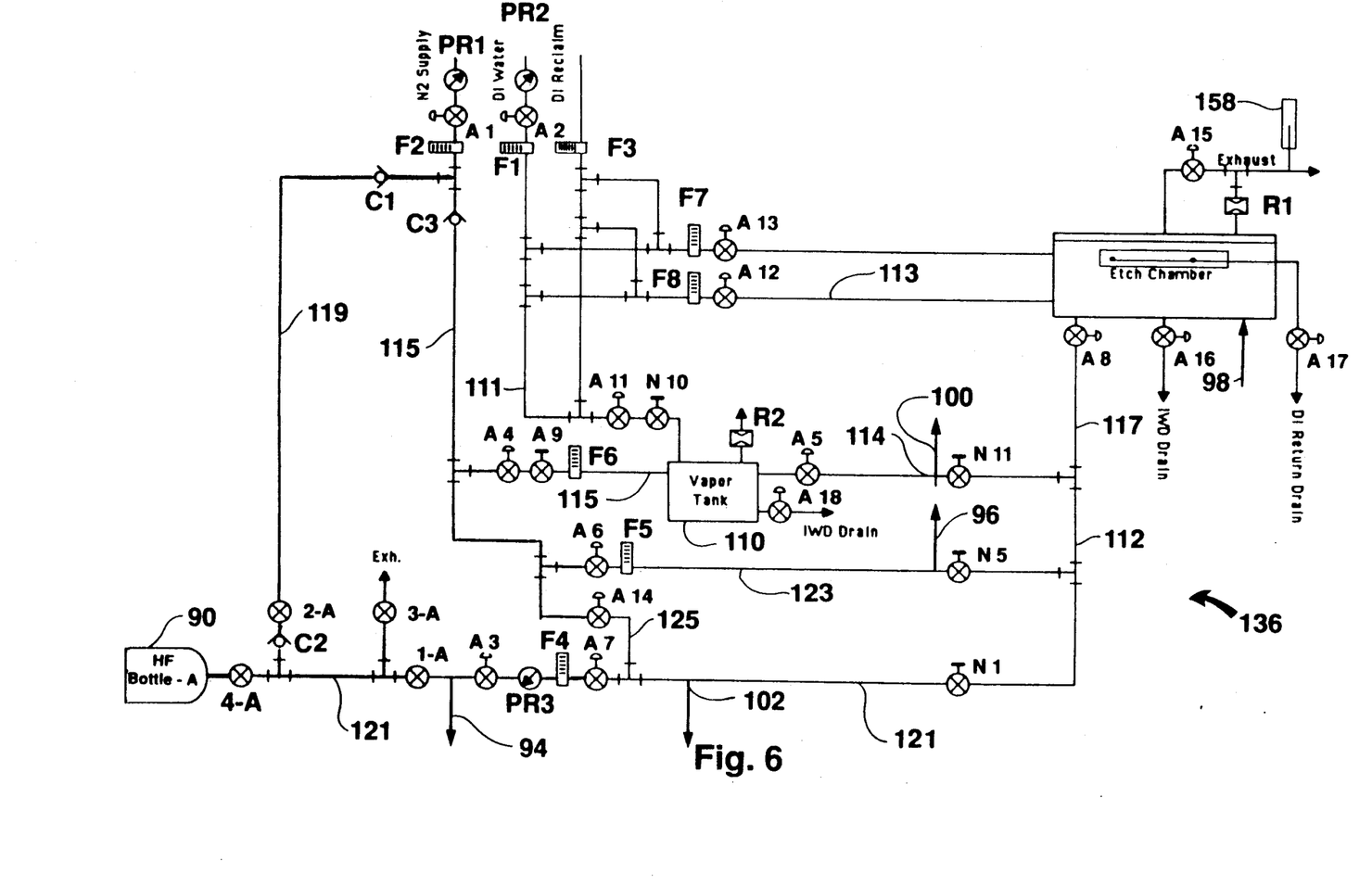
FIG. 6 is a piping and control schematic of the invention.

FIG. 6 is a piping schematic showing the major portions of process-control means of the HF acid etcher and cascade rinser.

In a preferred form of the invention, four HF supply bottles containing a pressurized supply of HF gas are contained within the housing 8. The HF supply bottles may be conventional high-pressure metal containers having a threaded outlet with a suitable pressure regulator and on-off valving arrangement.

In general, the process-control means includes an HF supply means for supplying HF etchant to the etching chamber 10, a DI water supply means for supplying DI water to the etching chamber 10, and a nitrogen $N_2$ gas supply means for supplying pure $N_2$ to the etching chamber and for purging. In a preferred form of the invention, there is a separate HF supply means, DI water supply means, and $N_2$ supply means for each separate chamber 13 of the etching chamber 10. For the purpose of illustration, only one of each of these supply means is shown in FIG. 6.

For clarity, only one of four HF gas supply bottles 90 is shown in the schematic of FIG. 6. Additionally, for purposes of illustration, conduits 92 and 94 are shown as conduits for the other three HF supply bottles. Similarly, only one $N_2$ gas purge supply conduit 96 is shown. Three other etchant gas conduits to the three remaining interior chambers 13 of the etch chamber 10, however, are provided. These three HF gas conduits are shown by arrow 98 in FIG. 6. Finally, the $N_2$ supply means includes three additional piping and valve systems which are denoted by arrow 100.

Conduit 102 provides HF gas flow to the other three chamber sections 13, as shown connected at arrow 98, through valves similar to N1 and A8.

As shown in FIG. 6, the process-control means includes an $N_2$ supply valve A1 and a DI water supply valve A2. Both valves A1,A2 are connected to pressure regulators PR1 and PR2 respectively to maintain constant inlet pressures of $N_2$ and DI. Valves A1,A2 are preferably actuated by electrical solenoid air valves which are automatically controlled by an automatic electrical sequence controller (shown and described later). Preferably, all the valves in the process-control circuit A1-A18 are air-operated remotely controlled valves, although other types of valves may also be suitable for this application. Valves N1-N14 are typically manually operated, needle valves for flow control.

A vapor tank 110 is provided for forming a water vapor from DI water in order to provide a vaporous mixture for etching. As previously explained, moisture is present to enhance the etching process on the wafer surface. DI water flows through flowmeter F1 and a first conduit path 111 through valves A11 and N10 to a vapor tank 110. A second DI conduit 113 provides DI rinse water directly to the etch chamber 10 via flowmeter F8 and valve A12.

$N_2$ is directed through an $N_2$ supply conduit 115 to the vapor tank 110. The $N_2$ supply conduit includes a valve A1 and a flowmeter F2. The $N_2$ conduit 115 also includes an exhaust leg 119, check valve C1, a manual valve 2-A, a second check valve C2, and exhaust valve 3-A, which also exhausts and purges HF gas. The $N_2$ supply conduit 115 includes a check valve C3, a valve A4, a valve N9, and a flowmeter F6 which are all located upstream of the vapor tank 110.

The HF supply means includes components generally indicated in the conduit 121. HF gas from gas bottle "A" flows through isolation valves 4A and 1A, air-operated valve A3, pressure regulating valve PR3, flowmeter F4, air-operated valve A7, and valve N1 to a gas mix line 112.

Piping connections from the vapor tank 110 where DI water is absorbed into the $N_2$ gas as it flows over the water, include a drain valve A18 for the vapor tank 110 and a relief valve R2. Additionally, flow from the vapor tank 110 into the etching chamber 10 is through valves A5 and N11. A gas mix loop 112 is provided for mixing the HF and $N_2$ prior to entry into the etch chamber through the moist gas mix line 117 and valve A8.

$N_2$ pipe conduit 123 provides $N_2$ gas for dilution of the HF gas, via valve A6, flowmeter F5, and valve N5. $N_2$ conduit 123 is coupled to a gas mix line 112 where the mixing occurs prior to injection into etch chamber 10.

Another $N_2$ conduit 125 provides for a purge of the HF piping via valve A14, through valve N1 and into the etch chamber via valve A8.

Each separate chamber section 13 of the etching chamber 10 is coupled to at least one DI reclaim water drain physically located on the floor of the chamber 13. Valves A16 and A17 are provided for disposing of the etching solution and DI rinse water, respectively.

Figure 8:
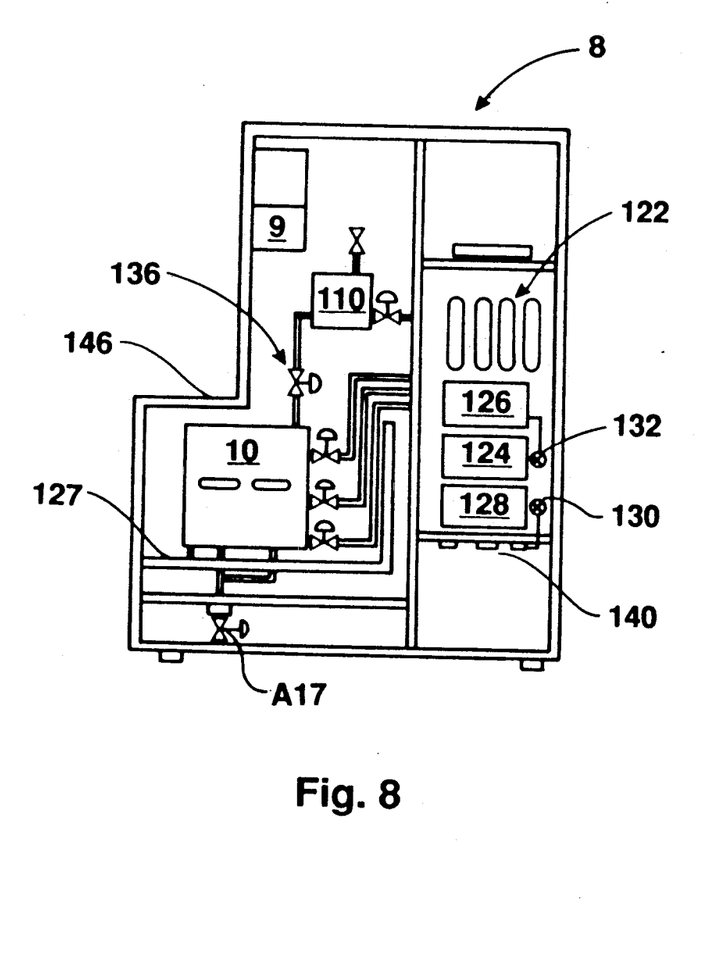
FIG. 8 is a side, sectional-view of the housing taken along lines 8—8 of FIG. 7.
Figure 9:
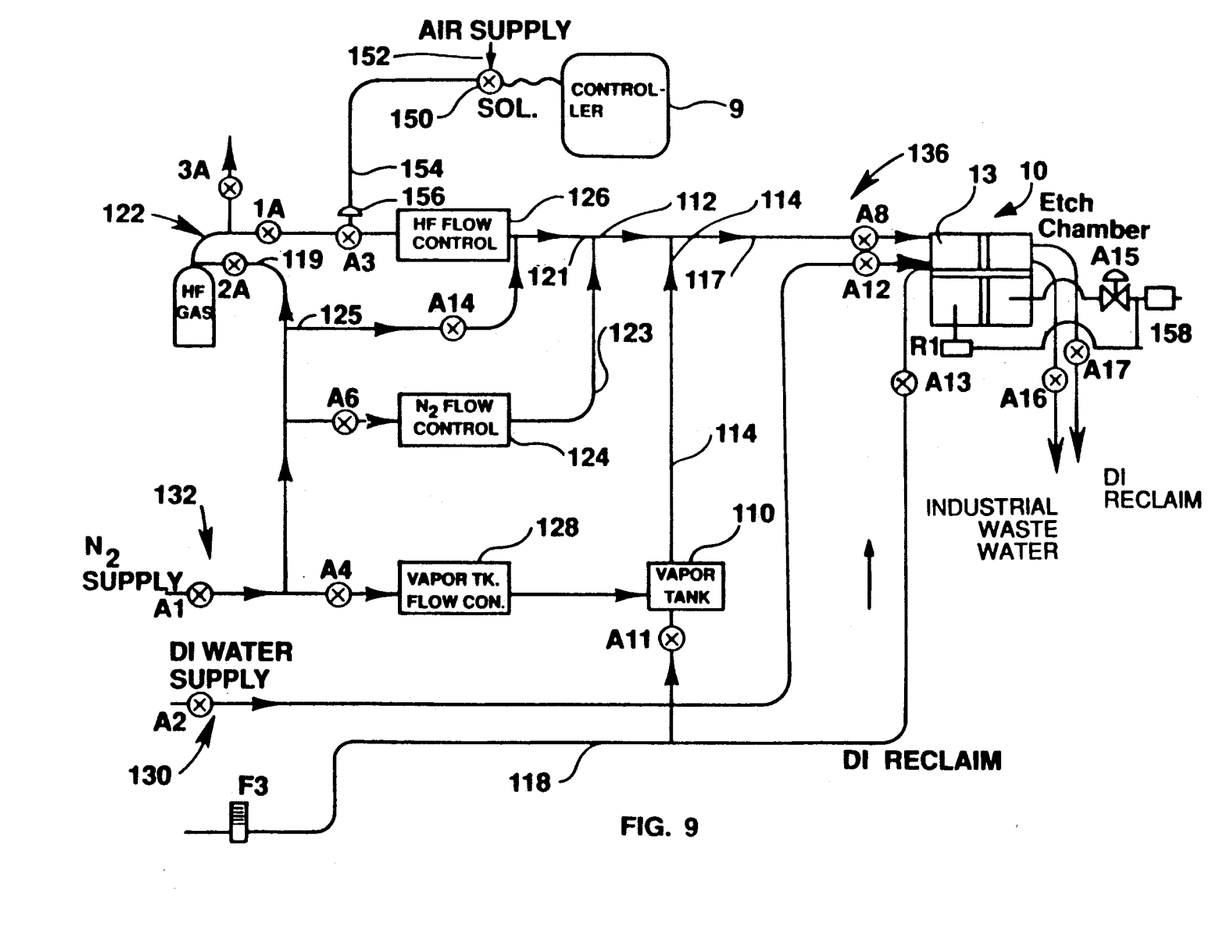
FIG. 9 is a schematic block diagram showing fluid and gaseous flow through the apparatus of the invention.

The chamber 10 also has an exhaust connection at valve A15 and an over-pressure rupture disc R1. DI water is also provided to the water spray nozzles at 28, 29, 40, and 42 via valve A13 through flowmeter F7. The water cascading from slots 53 (FIG. 2B) during wafer wash is discharged through valve A1 to the DI water return drain. Remaining rinse water is collected in a plenum 127 (FIG. 8) that drains through valve A16 to an industrial waste water connection outside housing 8 at 142 (FIG. 8). Chamber clean water is provided by DI reclaim conduit 118 via valve A13.

Figure 7:
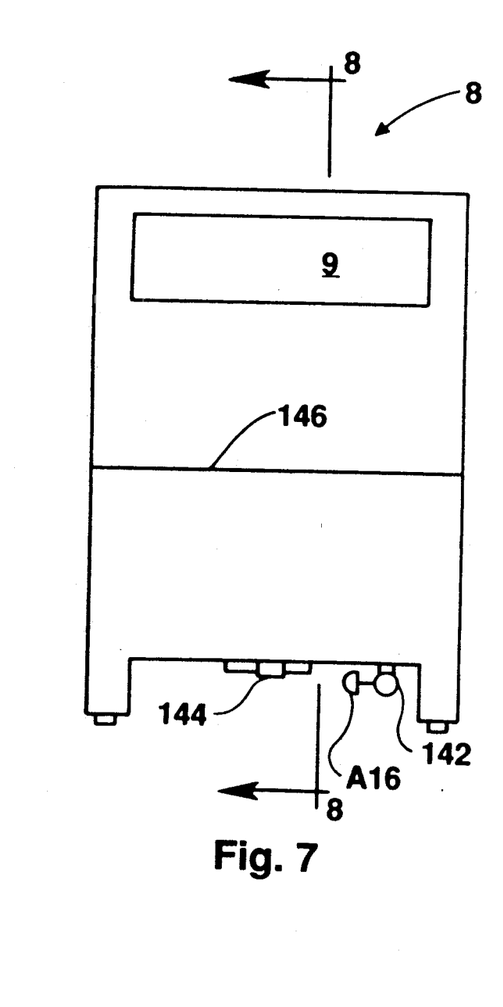
FIG. 7 is a front view of a housing of the invention.

Referring to FIGS. 7 and 8, housing 8 contains the process-control means described in FIG. 6. In general, this process-control means can be described as including an HF supply means 122 (FIG. 9), an $N_2$ flow-control means 124, an HF flow-control means 126, a vapor tank flow-control means 128, a DI water-supply means 130, a $N_2$ supply means 132, a control-panel means in the form of a controller 9, a vapor tank 110, and vapor tank piping and valve means 136. External connection for all necessary gases and water supplies can be provided at a single manifold 140 (FIG. 8). A single discharge conduit connection is denoted as 142 to discharge rinse water collected in plenum 127. An air exhaust connection is denoted as 144 in FIG. 7. Access to the etch chamber is at lid 146 which can be used to open and seal closed the housing 8. Various controls, meters, and gauges comprising the controller 9 can be conveniently located anywhere on the housing.

Operations will be described by generally referring to FIGS. 1, 2, 9, and 11. For simplicity and clarity, in FIG. 9, the controller 134 is shown electrically connected to only one solenoid 150 having an air supply at 152. In a preferred form of the invention, each air valve (valves beginning with "A") would have a similar solenoid connected via a suitable conduit 154 to an air piston 156 for operating the valve which is represented by valve A3. To start operation of the hydrofluoric acid etcher and cascade rinser, one or more wafer carriers 35 ar placed within the housing situated within an individual etching chamber 13. The cycle is started with introduction of $N_2$ purge gas to chamber section 13 via A6 and $N_2$ flow control 124. DI water is introduced to the vapor tank 110 through valve A11. $N_2$ is also directed to the vapor tank flow-control means 128.

When there is adequate $N_2$ flow to the flow-control means 124 and 128 and water flow to the vapor tank 110, HF gas is introduced via valve 1A and A3 to the HF flow-control means 126. HF gas output from flow control 126 mixes in gas mix conduit 112 with an $N_2$ output from $N_2$ flow-control means 124. The diluted HF gas enters a moistened $N_2$ gas conduit at 114 where it further mixes with an output from vapor tank 110 in a moistened mixed gas conduit 117. The moistened gas in line 117 enters one of the etch chamber sections 13 via valve A8. The acid etch gas enters the section via HF discharge orifices 60 on the divider 18 and HF discharge orifices 76 in the end sections 16 and 17 (FIG. 1). Pressure in the etch chamber, and therefore etch time, is regulated by controlling back pressure regulator valve A15 and the gas discharges to scrubber 158. After a short period, typically less than a minute, the etch cycle is terminated by closing valves A3, A4, A8, and A11.

A rinse cycle then commences by opening valve A12 directing water to supply orifice 30 and orifices 72 in end sections 16,17, causing water to cascade down from slot 53 after chamber section 13 fills up (see FIG. 1). Water leaves through drain plenum 142 (FIG. 7) and is returned to the industrial waste water via valve A16.

After completion of the rinse cycle, the etch chamber is cleaned by a further DI water spray via valve A13 supplying water to the spray post 26 and nozzles at 40 and 42.

After cleaning is complete, the cycle is stopped and the wafer carrier is then removed from the housing. An $N_2$ purge is initiated by opening valves 2A, 3A, and valves A6, A14, and A8; and when the chambers are dry, all valves are returned to a closed position and the chamber is ready for another batch load of wafer carriers.

It is apparent from the foregoing that a novel and unobvious acid etch and rinse apparatus has been provided. The acid etch and rinse apparatus provides for controlled etching and rinsing of a plurality of wafers. Moreover, the acid etch chamber of the invention provides for a thorough etching and cascade rinsing of the wafer without exposure to atmosphere. No moving parts are required and the cycles of etching, rinsing, and cleaning are completed automatically. While only one presently preferred embodiment has been described in detail, as will be apparent to those familiar with the art, certain changes and modifications can be made without departing from the scope of the invention as defined by the following claims.

What is claimed is:

1. An HF acid etcher and rinser apparatus for etching and rinsing a plurality of integrated circuit wafers comprising:

a sealable housing;

an etching chamber contained within the housing;

a vapor tank coupled to the etching chamber;

HF supply means for providing HF gas through an HF flow-control means to the etching chamber;

a nitrogen ($N_2$) supply means for providing $N_2$ gas through a $N_2$ flow-control means to the etching chamber and to the vapor tank;

a DI water-supply means in communication with the etch chamber and the vapor tank;

conduit and valve means for connecting an output from the HF gas flow-control means to an output from the $N_2$ flow-control means, to an output from the vapor tank $N_2$ flow-control means, and to the etch chamber; and an automatic controller means for controlling etch, rinse, clean, and purge cycle of the apparatus.

2. The apparatus as recited in claim 1 and wherein the housing further comprises:

an air-tight enclosure;

a lid on the front of the enclosure;

a plenum within the enclosure;

a plurality of conduit connections for air, water, and nitrogen supply and drain connections on a lower section of the housing; and a control panel on an upper section of the housing.

3. The apparatus as recited in claim 1 and wherein the etch chamber further comprises:

a pair of ends;

a top section;

a bottom;

a front and back section a plurality of box-like sections formed by the ends, front and back section, and an X-shaped center divider, the center divider having a plurality of conduits and connecting orifices that direct water and gas into the chamber sections onto the integrated circuit wafers contained within a wafer carrier;

a pair of slots for discharge of cascade rinse water in the ends of the chamber; and a drain connection for discharge of spray rinse water.

4. The apparatus as recited in claim 1 and wherein the vapor tank is coupled to the etch chamber by conduit means coupling an air-operated control valve to a needle valve and then to a gas and vapor mix line.

5. The apparatus as recited in claim 1 and wherein the HF gas means consists of a plurality of gas bottles communicating with the HF flow control means by a pair of HF tank isolation valves and conduits connecting in sequence:

a first air-operated valve;

a pressure regulating valve;

a flow meter;

a second air-operated valve; and a plurality of needle valves.

6. The apparatus as recited in claim 1 and wherein the nitrogen supply means consists of a pressure-regulating valve, a nitrogen air-operated valve, a flow meter, communicating with the nitrogen flow control means, and conduits connecting in sequence:
- an air-operated valve;
- a flow meter; and
- a plurality of needle valves.

7. The apparatus as recited in claim 1 and wherein the nitrogen supply means to the vapor tank comprises:
- a conduit connecting the supply means to an air-operated valve;
- a needle valve; and
- a flow meter connecting to the vapor tank.

8. The apparatus as recited in claim 1 and wherein:
- a DI water supply conduit connects to the vapor tank through an air-operated valve and a needle valve; and
- a conduit from the DI water supply connects to the etch chamber via a flow meter and an air-operated valve.

9. The apparatus as recited in claim 3 and wherein the conduit and valve means comprises a plurality of a gas mixing lines connecting to moist $N_2$ gas lines connecting to air-operated valves which connect to the box-like sections of the etch chamber.

10. The apparatus as recited in claim 1 and wherein the automatic controller has an output to a plurality of electrically operated air-solenoid valves that supply air to the air-operated valves that are part of the HF supply means, the HF flow control means, the DI water supply means, the $N_2$ flow control means, and the etch chamber conduit and valve means.

11. A method of etching and washing a plurality of integrated circuit (IC) wafers comprising:
- loading the wafers into a plurality of wafer carriers;
- placing the wafer carriers within the etch chamber which is contained in a plenum;
- activating an automatic controller that controls an etch cycle;
- purging the etch chamber with nitrogen;
- turning on a nitrogen, water, and hydrogen fluoride (HF) supply means to provide a moisturized etch vapor to an etch chamber section;
- etching a layer of silicon oxide from the IC wafers;
- stopping the HF and water supply means to terminate the etch;
- opening a plenum drain valve and a DI cascade rinse water supply valve to supply water to the chamber;
- rinsing the wafer carriers and wafers;
- securing the rinse;
- initiating a chamber cleaning rinse;
- stopping the cycle;
- removing the wafer carrier from the chamber;
- draining the water from the chamber and plenum;
- purging the chamber with nitrogen;
- closing the drains; and
- stopping the nitrogen purge.

12. The method as recited in claim 11 and wherein the etching time is less than on minute.

13. The method as recited in claim 11 and wherein the cascade rinse water exits the chamber section at a slot in a wall of an end of the chamber.

* * * * *